United States Patent

Ohya et al.

[11] 4,016,588
[45] Apr. 5, 1977

[54] NON-VOLATILE SEMICONDUCTOR MEMORY DEVICE

[75] Inventors: Shuichi Ohya; Masanori Kikuchi, both of Tokyo, Japan

[73] Assignee: Nippon Electric Company, Ltd., Tokyo, Japan

[22] Filed: Dec. 24, 1975

[21] Appl. No.: 644,056

[30] Foreign Application Priority Data

| Dec. 27, 1974 | Japan | 50-1867 |
| Dec. 27, 1974 | Japan | 50-1869 |
| Dec. 27, 1974 | Japan | 50-1871 |
| Dec. 27, 1974 | Japan | 50-1872 |
| Dec. 27, 1974 | Japan | 50-1873 |
| Dec. 27, 1974 | Japan | 50-1876 |

[52] U.S. Cl. ............... 357/23; 307/238; 357/13; 357/41; 357/54; 357/89
[51] Int. Cl.² ........................... H01L 29/78
[58] Field of Search ............ 357/23, 89, 41, 13; 307/238

[56] References Cited

UNITED STATES PATENTS

| 3,868,187 | 2/1975 | Masuoka | 357/23 |
| 3,919,711 | 11/1975 | Chou | 357/23 |

*Primary Examiner*—William D. Larkins
*Assistant Examiner*—Marcus S. Rasco
*Attorney, Agent, or Firm*—Hopgood, Calimafde, Kalil, Blaustein & Lieberman

[57] ABSTRACT

A non-volatile semiconductor memory device includes a gate insulating film which has a relatively thin portion in the vicinity of one of the source and drain regions at which p-n junction breakdown is performed for carrier injection.

6 Claims, 31 Drawing Figures

NON-VOLATILE SEMICONDUCTOR MEMORY DEVICE

This invention relates generally to non-volatile semiconductor memory devices, and particularly to an avalanche injection type insulated gate field effect transistor for an electrically programmable non-volatile memory device.

Several avalanche injection type MOS memory transistors having a floating gate have been proposed. For example, Proceedings of the 3rd Conference on Solid State Devices, Tokyo, 1971, pp. 155 to 162 describes a 2-junction type floating gate MOS transistor and Proceedings of the 4th Conference on Solid State Devices, Tokyo, 1972, pp. 158 to 166 describes a stacked-gate avalanche-injection type MOS (SAMOS) memory. These prior art devices comprise an n-type semiconductor substrate, p-type source and drain regions, a gate insulating film having a uniform thickness of about 1,000 to 2,000A formed on the channel area between the source and drain regions, a floating gate on the gate insulating film, a second insulating film covering the surface of the floating gate, and a control gate electrode on the second insulating film. In these prior art devices, a write-in operation is performed by applying a negative high voltage to the drain (or the source) and a positive voltage to the control gate to cause breakdown of the drain (or source)-substrate junction and to inject the high energy electrons generated by this break-down into the floating gate. A very high voltage is required for this operation because of the use of p-n junction break-down, and a long period of time is also required because electrons are injected through the gate insulating film. U.S. Pat. No. 3,868,187 proposes to use a highly-doped auxiliary region abutting against the drain (or source) region in an effort to decrease the voltage to be used for carrier-injection. However, the voltage and time required for a write-in operation in this device are also considered excessive for effective use in a memory. In particular, a practically usable n-channel memory device has heretofore been difficult to realize, because the injection of holes, which are used for the write-in operation in the n-channel device, is extraordinarily difficult as compared to that of electrons. In some prior art devices, the injection of holes generated by the p-n junction break-down into the floating gate is used to erase the already memorized information. Such erasing operation has equally encountered the problems of the necessity of a very high voltage for p-n junction breakdown and of a very long time for carrier injection.

It is, therefore, an object of this invention to provide a non-volatile semi-conductor memory device in which injection of charge carriers into a floating gate can be performed with a low voltage and for a short period of time.

The memory device of the invention is characterized by a partially thin gate insulating film in a stacked-gate type memory structure. The gate insulating film is partially thin at least in the vicinity of the source region and/or the drain region at which p-n junction breakdown is performed for carrier injection. For example, where a write-in operation or an erasing operation is performed by the injection of charge carriers into the floating gate due to the breakdown of the drain (or source) junction, a thin insulating film of, e.g., 700A to 100A is formed in the vicinity of the drain (or source) region, while a thick insulating film of, e.g., 1,000A to 2,000A is formed on the remaining channel area. Also, where a write-in operation and an erasing operation are performed due to breakdown of the drain and the source junctions, a thin portion of the gate insulating film is formed near the drain and the source regions. The thin portion of the gate insulating film improves the efficiency of carrier injection and junction breakdown and remarkably decreases the period of time and voltage required for a write-in and/or erasing operation of the memory device. The thick portion of the gate insulating film ensures the effect of the control gate voltage on the floating gate potential and also provides excellent data retention and reliability of the memory device. An auxiliary region of the same conductivity type as, but a higher impurity concentration than, the semiconductor substrate may be provided underneath the thin portion of the gate insulating film and in contact with the drain (or source) region at which junction breakdown is performed for the write-in of information. The breakdown is limited to the small junction area of this auxiliary region and the drain (or source) region and hence electric current for the write-in operation can be reduced.

The principles and other features of this invention will be clearly understood from the following description of various embodiments, thereof taken in conjunction with the accompanying drawings in which.

Figure 1A:
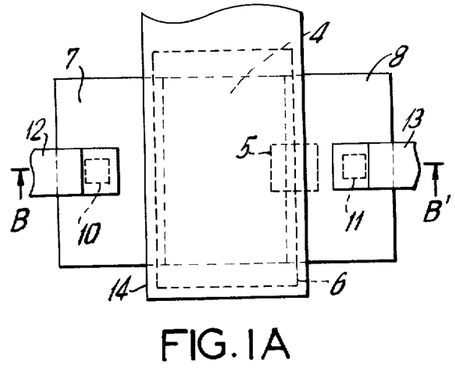
FIG. 1A is a plan view of first and third embodiments of this invention.
Figure 1B:
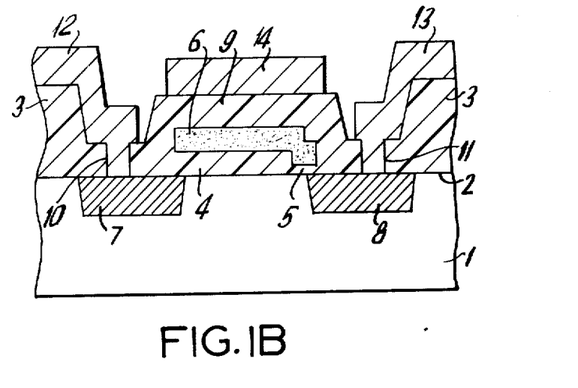
FIG. 1B is a cross sectional view taken along line B–B' of FIG. 1A.
Figure 2A:
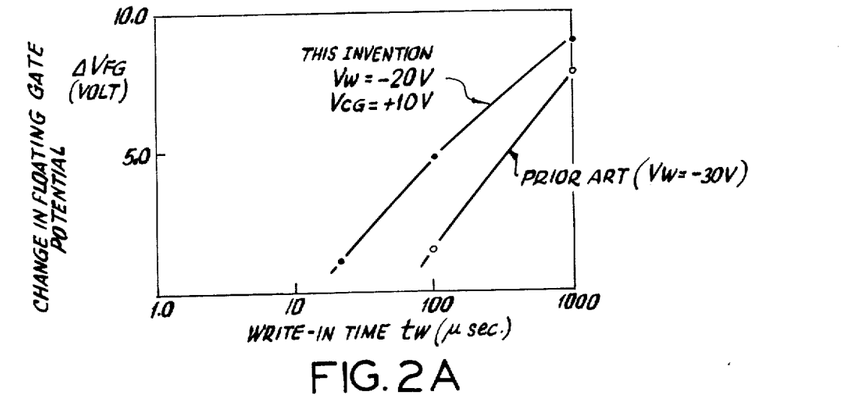
FIGS. 2A and 2B are graphs showing advantages of the structure of FIG. 1.
Figure 2B:
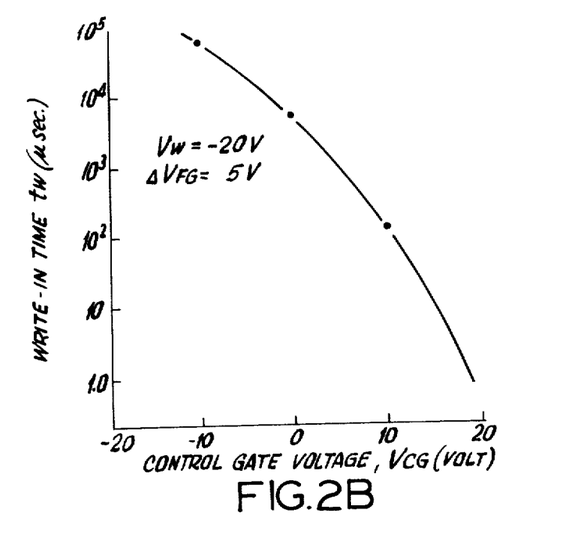

EMBODIMENT 1 (FIGS. 1 AND 2)

A p-channel type stacked-gate memory transistor according to a first embodiment of the invention is fabricated, as shown in FIGS. 1A and 1B by preparing an n-type silicon single crystal substrate 1 having a specific resistivity of 5Ω-cm, forming a silicon dioxide film 3 by thermal oxidation on one main surface 2 of the substrate 1, selectively removing the oxide film 3 from the prospective source, drain and channel regions such as a photo-etching method, forming a gate insulating film 4 of silicon dioxide of about 1,000A in thickness by thermal oxidation on the exposed surface of the substrate, then removing a small area of the gate insulating film 4 in the vicinity of a prospective drain region by the photo-etching method, and forming a thin gate insulating film 5 by thermal oxidation on the again-exposed surface of the substrate. After these processes, the thick gate insulating film 4 finally becomes about 1,200A in thickness. Following processes are the same as those used in the fabrication of conventional silicon-gate type MOS transistors. That is, a polycrystalline silicon layer having a thickness of about 5,000A is deposited over the oxide films 3, 4 and 5 by thermal recomposition of silane gas and is selectively removed by a photo-etching method to leave a polycrystalline silicon floating gate electrode 6. Then, boron as a p-type impurity is diffused or implanted into the substrate 1 with the floating gate electrode 6 and field oxide film 3 used as a mask, to respectively form p$^+$-type source and drain regions 7 and 8. A silicon dioxide film 9 having a thickness of about 5,000A is deposited by chemical vapor deposition method, and contact holes 10 and 11 are opened by the photo-etching method. An aluminum layer is then deposited to a thickness of about 1 micron by evaporation and selectively removed to leave source and drain electrodes 12 and 13 as well as a control gate electrode 14.

In a structure, such as that shown in FIG. 1, the breakdown voltage of the p$^+$-n junction between the p+ region of the source or drain region and the n-type substrate is about 35 volts. In a write-in operation in this device, the substrate 1 and the source electrode 12 are grounded, and a control gate voltage $V_{CG}$ of +10 volts and a write-in pulsing voltage $V_W$ of −20 volts are respectively applied to the control gate 14 and to the drain electrode 13. As shown in FIG. 2A, which shows the change in potential of the floating gate 6 as a function of write-in time or a time-duration of the write-in pulse $V_W$, the write-in operation in the device of this embodiment is performed for a very short period of time with a low write-in voltage in comparison with the prior art device without a control gate. FIG. 2B shows the write-in time necessary to obtain a change in the floating gate potential by 5 volts as the function of a voltage applied to the control-gate. As is seen from FIG. 2B, the write-in time becomes remarkably short as the positive voltage of the control gate increases and, for example, may become as short as several hundred nanoseconds at a control gate voltage $V_{CG}$ of +20 volts. Thus, a rapid write-in operation with a lower voltage is possible according to this invention. Erasure of the information in this device may be performed by irradiating X-rays or ultra-violet rays to the floating gate to allow the back injection of the injected electrons into the substrate or to inject holes into the floating gate by breakdown of the source junction.

Since the effect of the control gate voltage $V_{CG}$ on the floating gate is evaluated by $V_{CG} C_2/(C_1 + C_2)$, wherein $C_1$ denotes the capacitance between the floating gate and the substrate and $C_2$ denotes the capacitance between the control gate and the floating gate, the control gate voltage becomes more effective as capacitance $C_1$ is smaller, or as the gate insulating film is thicker, provided that capacitance $C_2$ is constant. The electric field directed from the floating gate to the drain contributes injection of the charge carriers into the floating gate. Where such electric fields at the thick portion 4 (thickness $\phi_{OX}$) and at the thin portion 5 (thickness $\phi_O$) of the gate insulating film are respectively represented by $E_1$ and $E_2$, $E_2/E_1$ may be determined by $\phi_{OX}/\phi_O$, if the thin portion is limited to a small area. Thus, a large electric field of $\phi_{OX}/\phi_O$ times is obtained at the thin gate insulating film portion 5. To conclude, a high efficiency of carrier injection is possible with a high efficiency of the control gate voltage upon the floating gate, according to this invention.

Figure 3A:
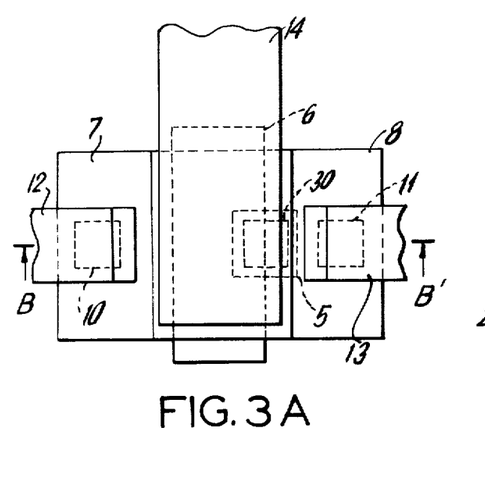
FIG. 3A is a plan view of second and fourth embodiments of the invention.
Figure 3B:
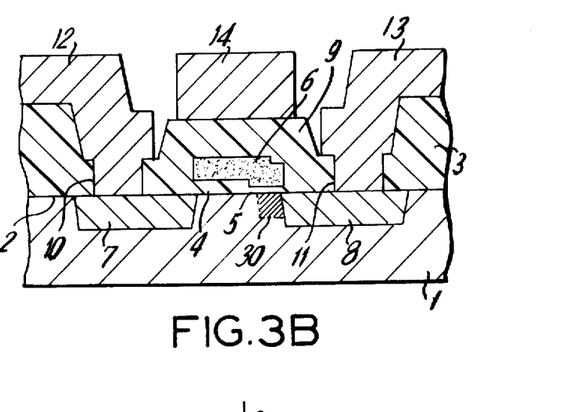
FIG. 3B is a cross-sectional view taken along line B–B' of FIG. 3A.

EMBODIMENT 2 (FIG. 3)

Referring to the embodiment of the invention illustrated in FIGS. 3A and 3B, a p-channel memory device is fabricated by using the same substrate 1 as that of the first embodiment selectively diffusing phosphorus into a prospective channel region of the substrate 1 to form an n+ region 30, and then forming a field oxide film 3, a gate insulating film 4, a thin portion 5 thereof, a floating gate 6, an overlying insulating film 9, source and drain regions 7 and 8, source and drain electrode 12 and 13, and a control gate electrode 14 by the same methods as and with the same dimensions as those of the first embodiment. As a result, the structure of this embodiment is the same as the first embodiment, with the exception of the n+ region 30 which is formed in the channel region underneath the thin portion 5 of the insulator so as to abut against the drain region 8. In this device, a write-in operation is performed, for example, by connecting the substrate 1 and the source region 7 to ground and applying −20 volts to the drain region 8 to cause breakdown of the drain junction at the n+ region 30 and the p+ drain region 8 and to inject electrons having high energy into the floating gate 6 through the thin gate insulating film 5. Where the control gate voltage is +5 volts, the write-in time is several ten nanoseconds, while with $V_{CG}$ of +10 volts, the write-in time is several nanoseconds. The erasure of the memorized information can be performed by a similar method to that described in the first embodiment. By using the auxiliary n+ region 30 according to this embodiment, a further reduction in the write-in time voltage and a decrease in the write-in current can be attained.

Figure 4A:
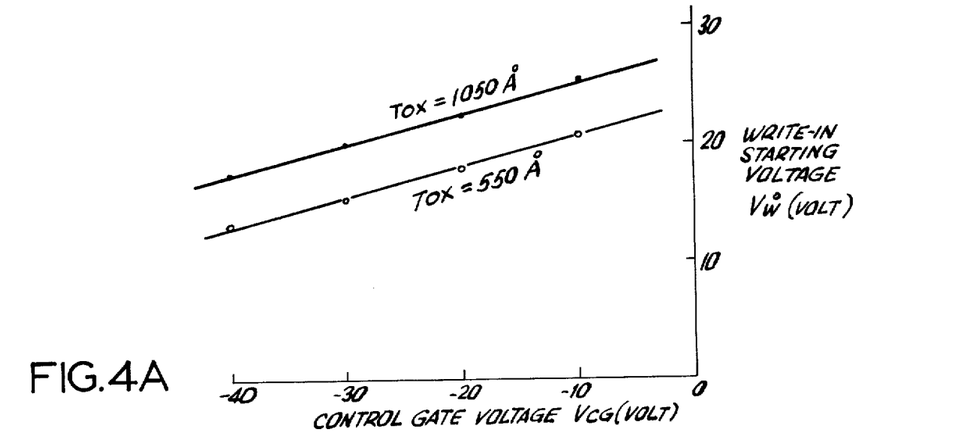
FIGS. 4A to 4C and 5 are graphs showing advantages of the third embodiment.
Figure 4B:
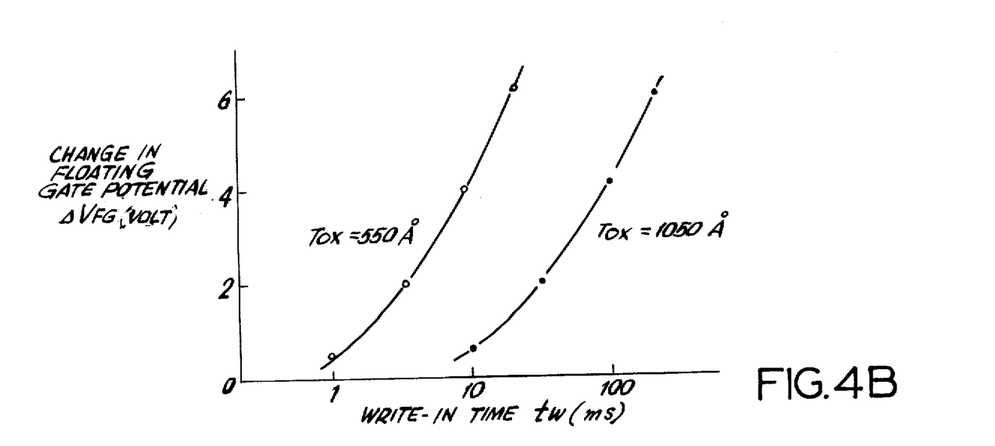
Figure 4C:
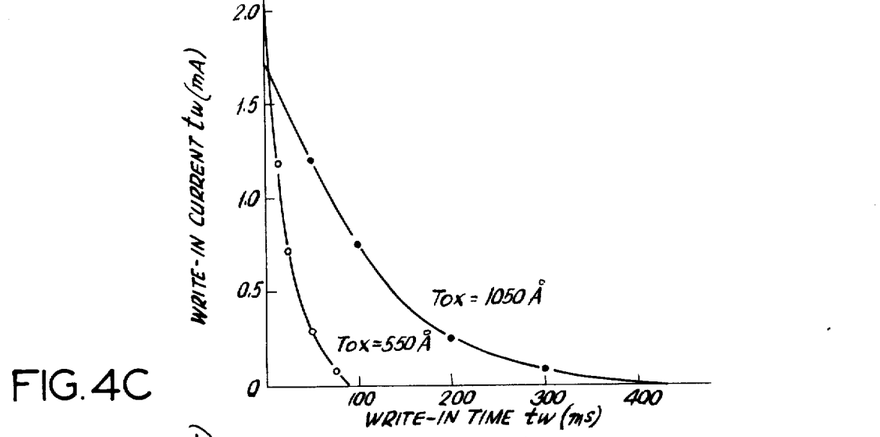
Figure 5:
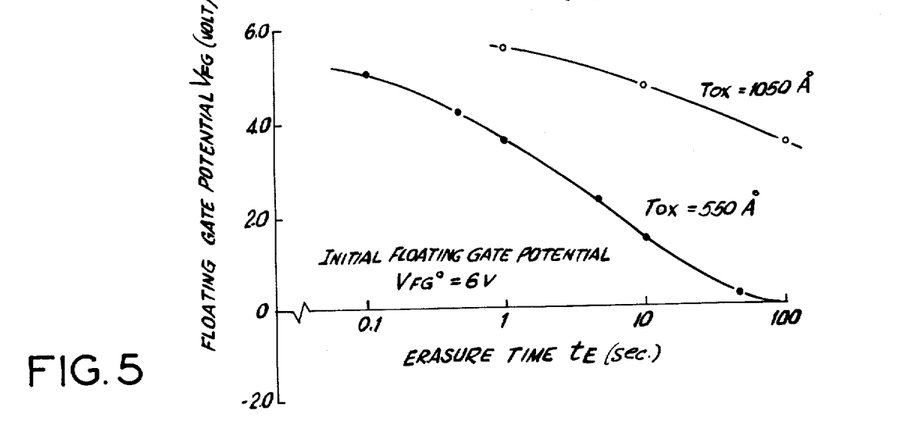

EMBODIMENT 3 (FIGS. 1, 4 AND 5)

An n-channel type stacked-gate memory transistor according to a third embodiment of the invention has the same structure as the first embodiment, except for the following:

Substrate 1 — p-type silicon with a specific resistivity of 4Ω-cm;

Thickness of the thick gate insulating 4 — 1,050A;

Thickness of the thin gate insulating film 5 — 550A; and

Source 7, drain 8 and floating gate 6 — doped with phosphorus (n+ type).

With such device, the write-in is performed by injecting hot holes into a floating gate 6 by applying a write-in operation voltage of a positive value (e.g., 40 volts) to the drain region 8 and a negative voltage (e.g., −40 volts) to the control gate, while applying −5 volts to the substrate 1, to cause breakdown of the drain junction. Alternately, by using the region 8 as a source and the region 7 as a drain, the write-in voltage can be applied to the source to cause breakdown of the source junction. In any case, the write-in characteristics as shown in FIG. 4B are obtained under these conditions. As is seen from FIG. 4B, the write-in time becomes 1/10 by using the thin gate insulating film ($\phi_{OX}$ = 550A) in comparison with the uniformly thick gate insulating film (that is, $\phi_{OX}$ = 1,050A). In this device, the voltage necessary to start the write-in operation is lower than in the prior art device without the partially thin gate insulating film and decreases with an increase in the absolute value of the control gate voltage, as shown in FIG. 4A. Moreover, the write-in current is lower or the write-in time with a constant write-in current is shorter than the prior art device, as shown in FIG. 4C.

On the other hand, by applying positive voltages to the drain region 8 and the control gate 14, hot electrons can be used for erasure of the memorized information such as caused by hole injection from the source side. In an example, with the control gate voltage of 40 volts and an erasure voltage applied to the drain of 40 volts, and with the substrate voltage of −5 volts, the results as shown in FIG. 5 are obtained. As shown, the erasure time becomes 1/100 by using the partially thin gate insulating film.

Figure 6:
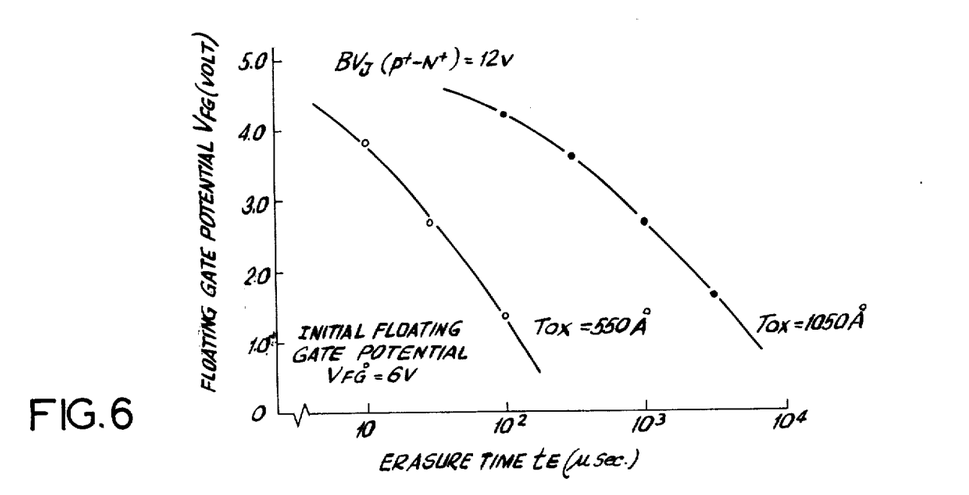
FIG. 6 is a graph showing advantage of a fifth embodiment.

EMBODIMENT 4 (FIGS. 3 AND 6)

An n-channel type memory transistor having the same structure as that of the third embodiment, except for being provided with a p+ type auxiliary region (like region 30 in FIG. 3B) under the thin gate insulator portion and in contact with the drain region is fabricated. The breakdown voltage of the p+ − n+ junction between the p+ type auxiliary region and the drain region is 12 volts. When the control gate voltage, the erasing voltage (to be applied to the drain region), and the substrate voltage are 30 volts, 15 volts, and −5 volts, respectively, this device shows the erasing characteristics as represented by FIG. 6. As is seen from FIG. 6, the erasing time $t_E$ becomes 1/20 to 1/50 by using the partially thin gate insulating film, in comparison with the prior art device with the p+ auxiliary region but without the thin portion of the gate insulating film.

Figure 7:
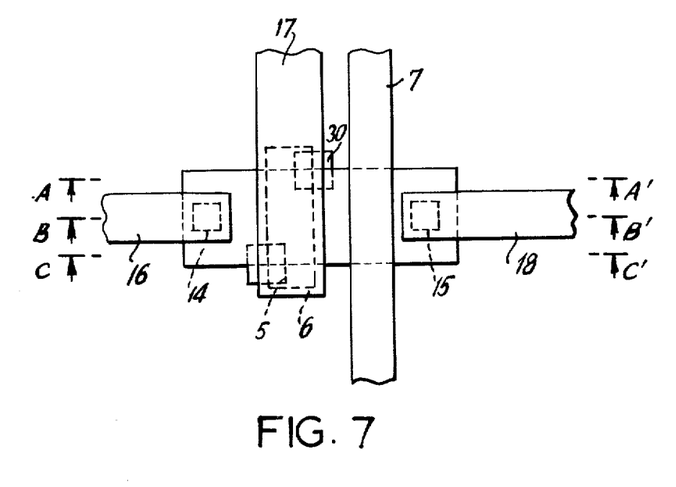
FIG. 7 is a plan view of a fifth embodiment of the invention.
Figure 8A:
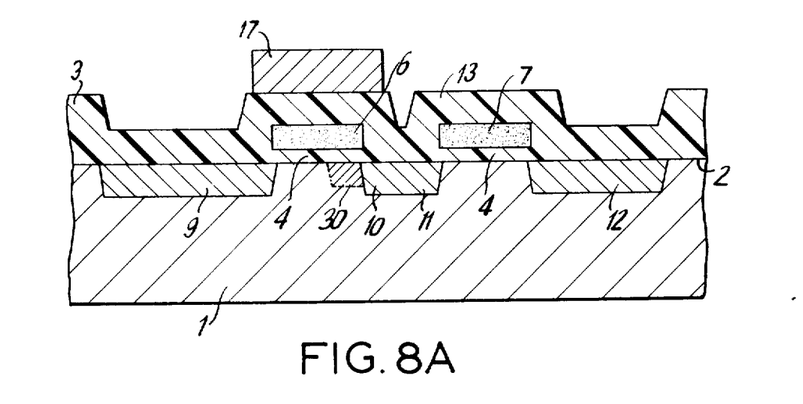
FIGS. 8A to 8C are cross-sectional views respectively taken along lines a–a', b–b', and c–c' of FIG. 7.
Figure 8B:
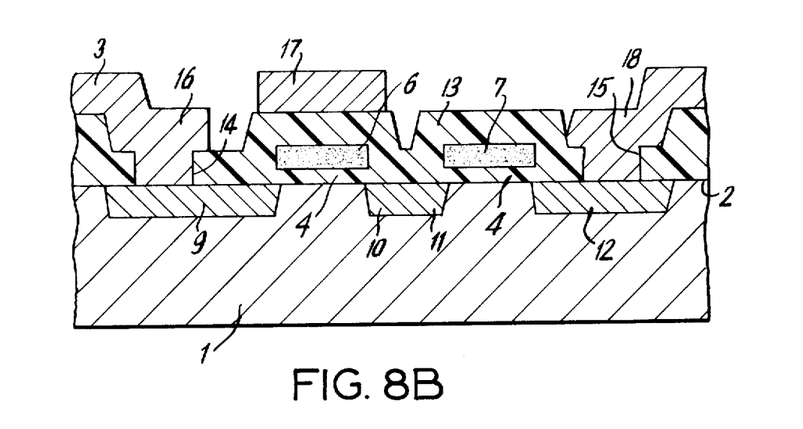
Figure 8C:
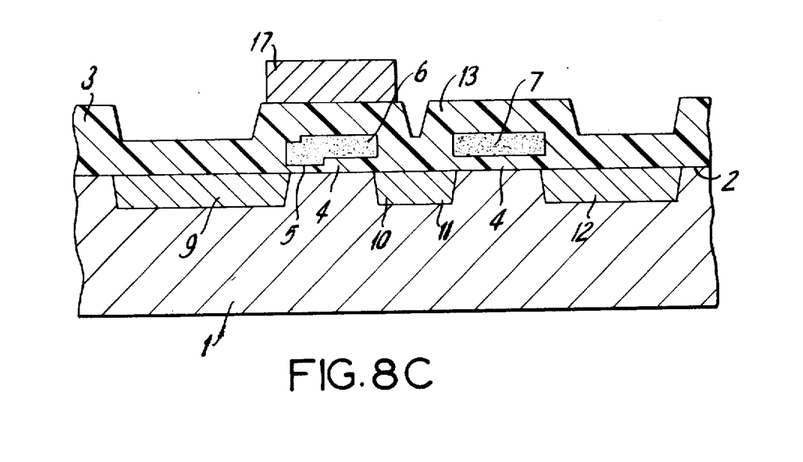
Figure 9:
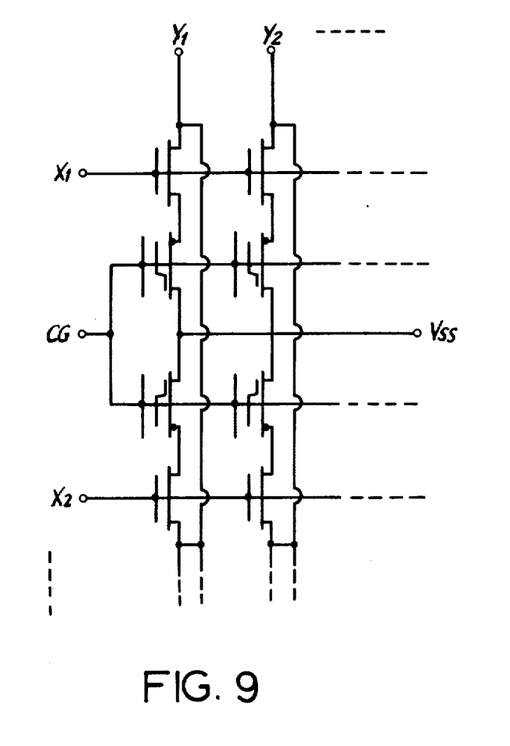
FIG. 9 is a circuit diagram of a memory matrix using the fifth embodiment of the invention.
Figure 10A:
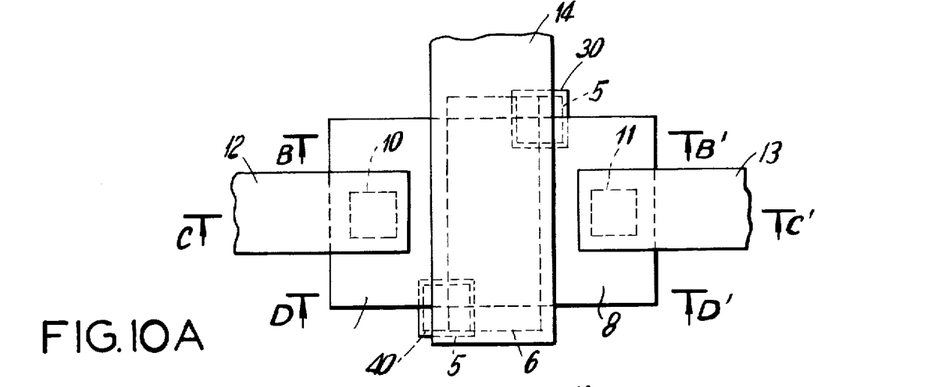
FIG. 10A is a plan view of a sixth embodiment of the invention.
Figure 10B:
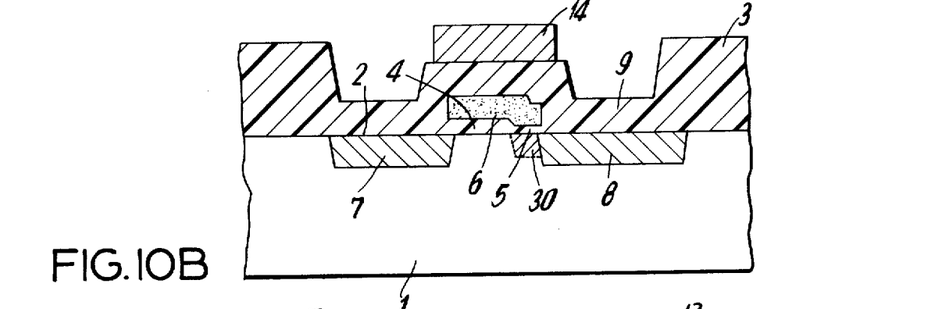
FIGS. 10B to 10D are cross-sectional view respectively taken along lines B–B', C–C', and D–D' of FIG. 10A.
Figure 10C:
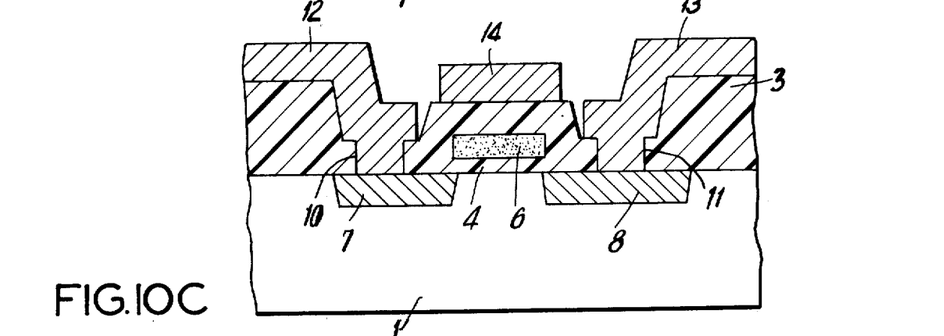
Figure 10D:
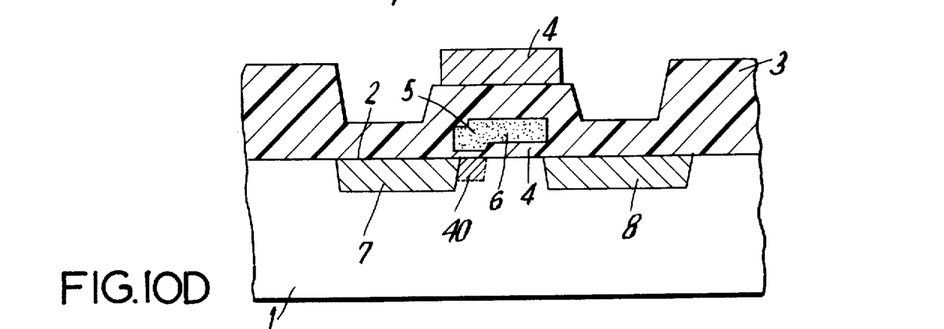

EMBODIMENT 5 (FIGS. 7 TO 9)

The fifth embodiment of the invention as illustrated in FIGS. 7 and 8, provides an n-channel type memory transistor integrated with an n-channel type switching transistor. In the p-type silicon substrate 1 of a resistivity of 10Ω-cm, n+ type source and drain regions 9 and 10 of the memory transistor and n+ type source and drain regions 11 and 12 of the switching transistor are formed as shown in FIGS. 7 and 8. A gate insulating film 4 of both transistors is made of silicon dioxide and is 1,200A in thickness. A thin portion 5 of 500A is formed in the gate insulating film in the vicinity of the source region 9, while a p+ type auxiliary region 30 is formed under the thick gate insulator adjacent the drain region 10. In this device, the breakdown voltage of the n+ − p junction between the source and drain regions 9 to 12 and the substrate 1 is about 35 volts, while that of the n+ − p+ junction between the p+ region 30 and the drain is about 10 volts. In such n-channel type memory transistor, a write-in operation can be performed by applying a high positive voltage to the source or a drain and a zero or negative voltage to the control gate to cause n+ − p junction breakdown at the source or the drain and thereby to inject holes into a floating gate. An erasing operation can be performed by applying a high positive voltage to the drain or the source and a positive voltage to the control gate to cause n+ − p junction breakdown at the drain or the source and thereby to inject electrons into the floating gate. In this embodiment, when the substrate voltage $V_{SUB}$, the control gate voltage $V_{CG}$, and the gate voltage $V_G$ of the switching transistor are −5V, −5V, and 0V, respectively, write-in can be performed by the application for several 10 milliseconds of a write-in pulse $V_W$ of 35V to the source 9 of the memory transistor. When $V_{SUB}$ = 5V, $V_{CG}$ = 20V and $V_G$ = 15V, erasure can be performed by the application of an erasure voltage of 15V to the drain 12 of the switching transistor for several hundred microseconds.

The device of FIG. 7 and FIG. 8 can be integrated as a memory cell in a large capacity reprogrammable memory device, as shown in FIG. 9. By using the common control terminals $X_1$, $X_2$ . . ., and connecting gate electrodes of switching transistors in each row and common terminals $Y_1$, $Y_2$ . . ., connecting drain regions of switching transistors in each column, any address (X$i$, X$j$) can be selected. Each memory transistor shown in FIG. 1, FIG. 3, FIG. 10, FIG. 12, or FIG. 14 can be connected with a switching transistor in the same manner as shown in FIGS. 7 and 8 and can be arranged as a matrix as shown in FIG. 9.

Figure 11A:
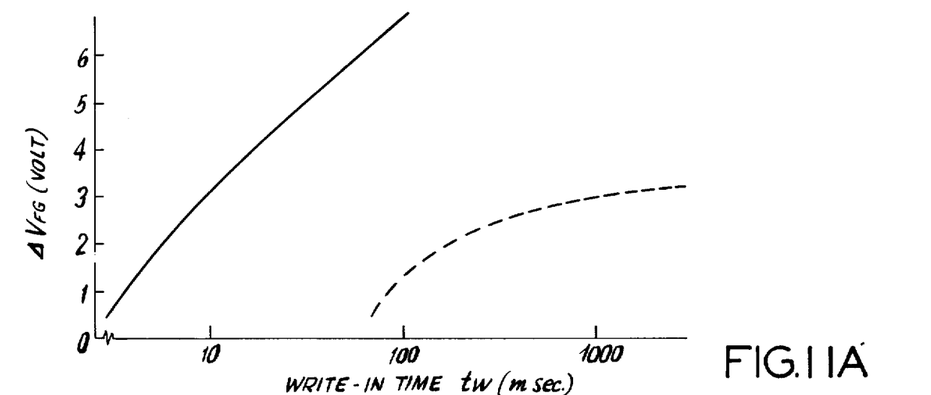
FIGS. 11A and 11B are graphs showing the effects of the sixth embodiment.
Figure 11B:
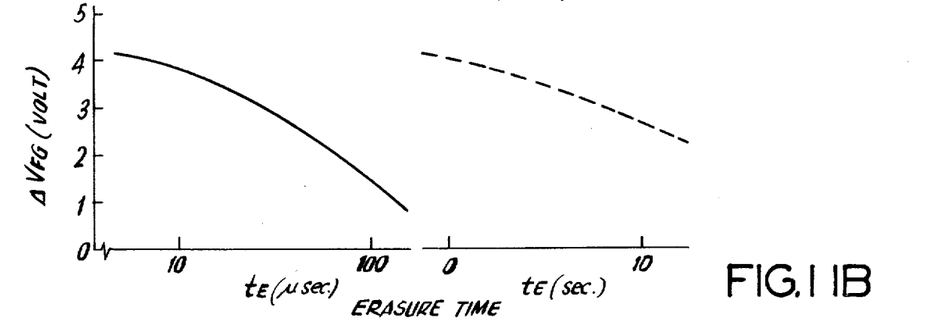

EMBODIMENT 6 (FIGS. 10 AND 11)

The sixth embodiment of the invention as illustrated in FIG. 10, provides an n-channel type memory transistor using a p-type silicon substrate of 10Ω-cm and having a similar structure to the memory transistor of the fifth embodiment. However, in this embodiment, a thin portion (500A thick) of the gate insulating film 4 (1,200A thick) is formed near the drain region 8 as well as the source region 7, and auxiliary p+ regions 30 and 40 are also formed under both the thin portions 5 and adjacent the drain and source regions 8 and 7. Breakdown voltages of the n+ − p junction (source, drain to substrate) and the n+ − p+ junction (source, drain to p+ region) are about 30V and about 12V, respectively. When $V_{SUB}$ and $V_{CG}$ are −5V and −30V, respectively, and drain 8 is open, the write-in characteristics of this device are as shown in FIG. 11A, with $V_W$ applied to the source 7 being 30V. In comparison with the prior art device (dotted curve), the device of this embodiment (solid curve) exhibits a short write-in time, 1/100 at $\Delta V_{FG}$ = 3V and 1/1,000 at $\Delta V_{FG}$ =3.5V. FIG. 11B shows the erasure characteristics under such conditions as $V_{SUB}$ = −5V, $V_{CG}$ = 30V, source open, and $V_E$ applied to the drain 8 of 1.5V for the device of this embodiment (solid curve) and $V_{SUB}$ = −5V, $V_{CG}$ = 45V, source open, and $V_E$ = 40V for the prior art device (dotted curve). FIG. 11B reveals that the erasure time of this embodiment device is as short as $10^5$ times of the prior art device.

Figure 12A:
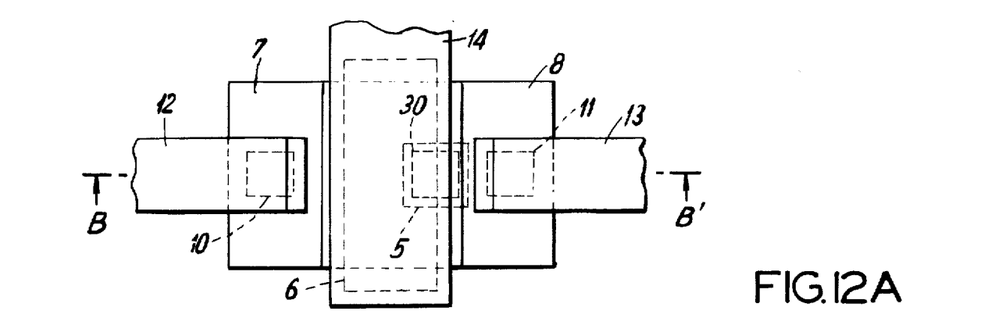
FIG. 12A is a plan view of a seventh embodiment of the invention.
Figure 12B:
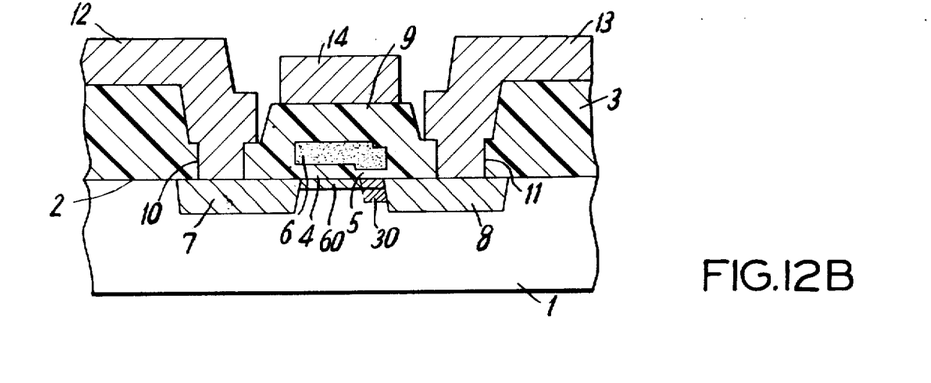
FIG. 12B is a cross-sectional view taken along line B–B' of FIG. 12A.
Figure 13A:
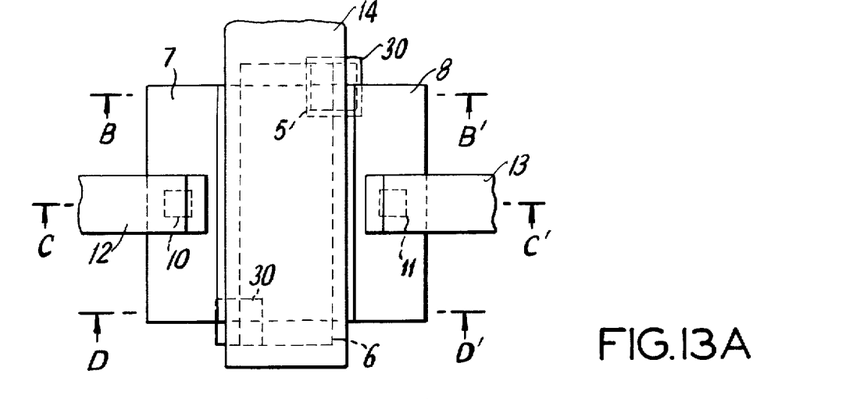
FIG. 13A is a plan view of an eighth embodiment of the invention.
Figure 13B:
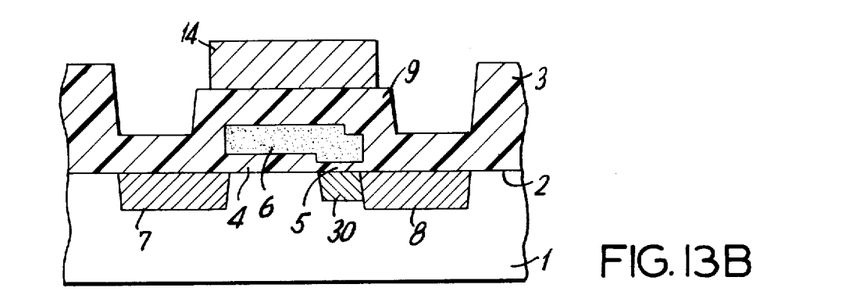
FIGS. 13B to 13D are cross-sectional views respectively taken along lines B–B', C–C', and D–D' of FIG. 13A.
Figure 13C:
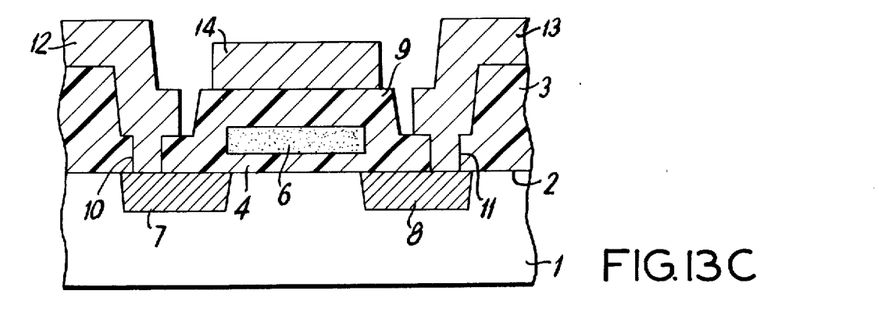
Figure 13D:
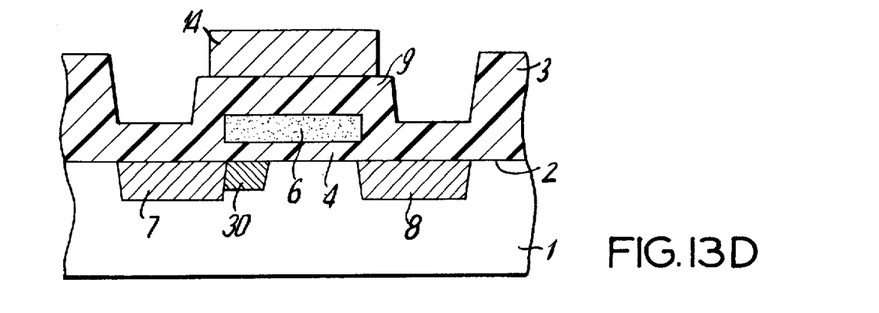

EMBODIMENT 7 (FIG. 12)

The seventh embodiment of the invention, as shown in FIG. 12, provides an n-channel depletion type memory transistor. This transistor has the same structure and dimensions as those of the memory transistor of the fifth embodiment, except for the following two points: (1) The thin portion 5 of the gate insulating film resides on the auxiliary p+ region 30 in the vicinity of the drain region 8; and (2) A lightly-doped n-type channel region 60 is formed over the surface area between the source and drain regions 7 and 8 by implanting phosphorus at an energy of 150eV and at a dose level of $8 \times 10^{11}/cm^3$ through a silicon oxide film of 1,000A in thickness. This device is of the depletion type, the threshold voltage being $-1.5V$ when $V_{SUB} = -5V$. In this device, a write-in operation is performed by applying positive voltages to the drain 8 and to the control gate 14 to cause the n+ − p+ junction breakdown between p+ region 30 and the drain region 8 and thereby to inject electrons into the floating gate 6. For example, when $V_{SUB} = -5V$, $V_{CG} = 20V$, $V_W$ at drain = 15V, and the source is open, the device is changed to the enhancement type with the threshold voltage being 5V after several hundred microseconds, and the write-in operation is completed. The erasure operation may be performed by irradiation of ultra-violet rays to release the injected electrons from the floating gate.

EMBODIMENT 8 (FIG. 13)

In the eighth embodiment of the invention as shown in FIG. 13, provides another n-channel type memory transistor which has the same structure and dimensions as those of the memory transistor of the sixth embodiment, except for the fact that a thin portion 5 of the gate insulating film is provided not in the vicinity of the source region 7 but only in the vicinity of the drain region 8. With this device, the write-in time is 10 milliseconds with $V_{CG} = -30V$, $V_{SUB} = 0$ to $-5V$, and $V_W$ (to the drain 9) = +30V, while the erasure time is 100 milliseconds with $V_{CG} = +40V$, $V_{SUB} = 0$ to $-5V$, and $V_E$ (to the source 7) = +20V.

Figure 14A:
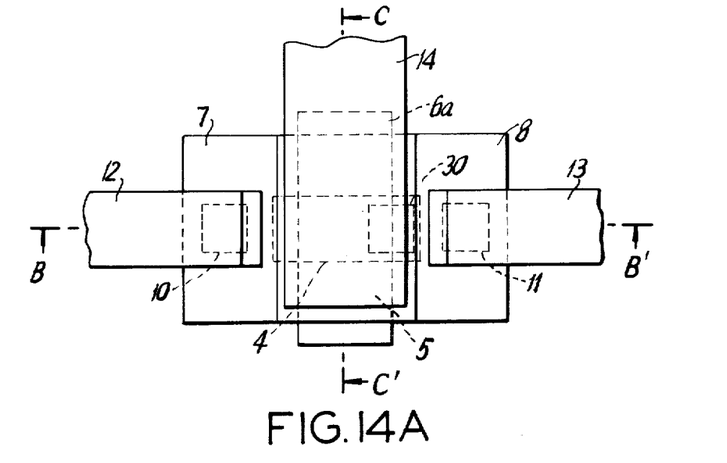
FIG. 14A is a plan view of a ninth embodiment of the invention.
Figure 14B:
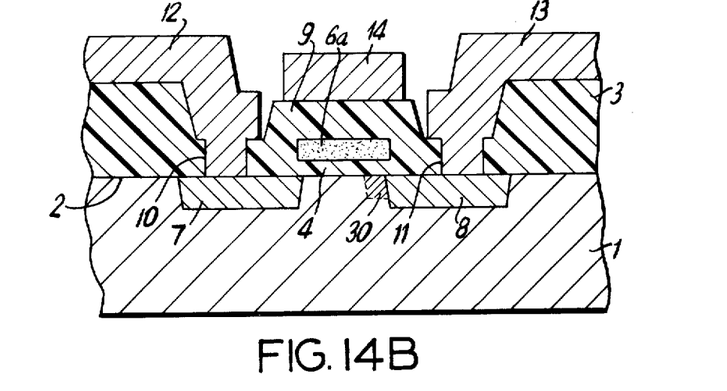
FIGS. 14B and 14C are cross-sectional views respectively taken along lines B–B' and C–C' of FIG. 14A.
Figure 14C:
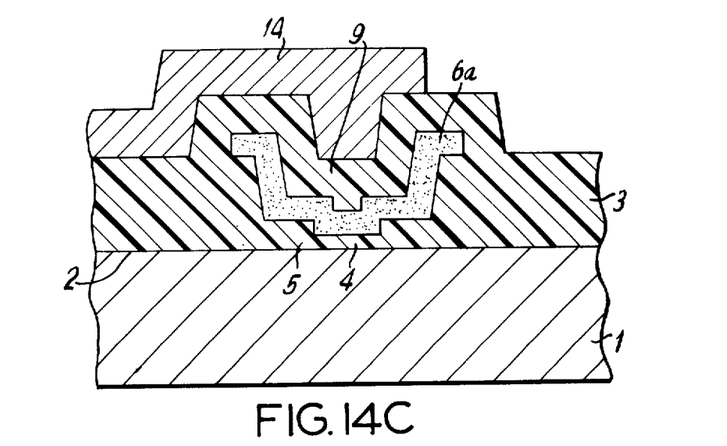

EMBODIMENT 9 (FIG. 14)

This invention, according to a ninth embodiment as shown in FIG. 14, also provides an n-channel type memory transistor having a p+ auxiliary region 30 adjacent to a drain region 8 and a thin portion 5 of the gate insulating film in the vicinities of both the source and the drain regions 7 and 8. In this device, a p-type silicon substrate of about 4Ω-cm is used and the thin gate insulating film 4 of silicon dioxide having a thickness of 550A is formed on the central portion of the channel region between the source and drain regions 7 and 8. A thick gate insulating film 5 of silicon dioxide having a thickness of 1,050A is formed at the both sides of the thin film 4 on the remaining portion of the channel region. Breakdown voltage of the n+ − p+ junction between the drain region 8 and the p+ junction between the drain region 8 and the p+ region 30 is about 7 volts.

In this memory device, the write-in operation can start when $V_{CG} = -40V$ is applied to the control gate 14 and a voltage of +13 V is applied between the source region 7 and the substrate 1, at which voltage the surface breakdown of the source to substrate junction starts. The erasure operation can start when a positive voltage is applied to the control gate 14 and a voltage capable of causing the breakdown of the drain to substrate (or p+ region 30) junction is applied between the drain region 8 and the substrate 1. When $V_{CG} = -40V$, $V_W$ (at the source) = 40V, and $V_{SUB} = -5V$, holes are injected to the floating gate 6a to increase the level of the floating gate potential to about 10V for the write-in time of about 1 second. When $V_{CG} = 25V$, $V_E$ (at the drain) = 25V and $V_{SUB} = -2V$, electrons are injected to the floating gate 6 to change the floating gate potential to about $-2V$ for the erasure time of about 1 millisecond. This device can be rewritten repeatedly and can retain the memorized information for quite a long period of time.

It will be evident that various modifications can be made to the described embodiments without departing from the scope of the novel concepts of this invention.

We claim:

1. In an avalanche injection type semiconductor memory device comprising a semiconductor substrate of one conductivity type, source and drain regions of the opposite conductivity type formed on the surface of said semiconductor substrate, a first insulating film formed over the channel area of said semiconductor substrate between said source and drain regions, a floating gate formed on said first insulating film, a second insulating film covering said floating gate, and a control gate formed on said second insulating film, the improvement which comprises: said first insulating film having a thin portion having a lesser thickness than the remaining portion thereof, said thin portion of said first insulating film being provided in the vicinity of at least one of said source and drain regions.

2. A non-volatile semiconductor memory device comprising a semiconductor substrate of one conductivity type, first and second spaced regions of the opposite conductivity type formed on the surface of said semiconductor substrate, a first insulating film formed on said substrate and overlying an area between said first and second regions, a floating gate formed on said first insulating film, a second insulating film covering said floating gate, a control gate formed on said second insulating film, and means for injecting charge carriers into said floating gate, said injecting means including means for applying a voltage to said first region of such polarity as to back-bias a p-n junction between said first region and said semiconductor substrate, said first insulating film including a thick portion and at least one thin portion, said thin portion of said first insulating film being positioned in the vicinity of said first region.

3. The memory device of claim 2, further comprising an auxiliary semiconductor region of said one conductivity type having a higher impurity concentration than that of said semiconductor substrate and formed in said area of said semiconductor substrate underneath said thin portion of said first insulating film so as to abut against said first region.

4. The memory device of claim 3, further comprising another semiconductor region of said opposite conductivity type formed on the surface of said area of said semiconductor substrate so as to connect with both said first and second regions.

5. The memory device of claim 3, in which said first insulating film further includes another thin portion in the vicinity of said second region.

6. The memory device of claim 1, further comprising an auxiliary semiconductor region of said one conductivity type having a higher impurity concentration than that of said semiconductor substrate and formed in said area of said semiconductor substrate underneath said thin portion of said first insulating film so as to abut against said one of said source and drain regions.

* * * * *